(12) United States Patent
Wong

(10) Patent No.: US 6,630,838 B1
(45) Date of Patent: Oct. 7, 2003

(54) METHOD FOR IMPLEMENTING DYNAMIC BURN-IN TESTING USING STATIC TEST SIGNALS

(75) Inventor: Barry Wong, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 110 days.

(21) Appl. No.: 09/768,861

(22) Filed: Jan. 23, 2001

(51) Int. Cl.$^7$ .................... G01R 31/02; G01R 1/04
(52) U.S. Cl. ............... 324/763; 324/754; 324/158.1
(58) Field of Search .................. 324/754–763, 324/158.1; 326/38–41, 46–47; 365/201; 361/760–764, 772–777; 174/255, 260, 261

(56) References Cited

U.S. PATENT DOCUMENTS

| | | |
|---|---|---|
| 3,603,746 A | 9/1971 | Helck |
| 3,843,938 A | 10/1974 | Bergman |
| 4,510,429 A | 4/1985 | Squire |
| 4,691,121 A | 9/1987 | Theus |
| 4,792,932 A | 12/1988 | Bowhers et al. |
| 4,795,964 A | 1/1989 | Mahant-Shetti et al. |
| 4,857,868 A | 8/1989 | Robb |
| 4,878,209 A | 10/1989 | Bassett et al. |
| 4,890,270 A | 12/1989 | Griffith |
| 5,048,064 A | 9/1991 | Rutherford |
| 5,083,299 A | 1/1992 | Schwanke et al. |
| 5,097,208 A | 3/1992 | Chiang |
| 5,181,191 A | 1/1993 | Farwell |
| RE34,363 E | 8/1993 | Freeman |
| 5,294,559 A | 3/1994 | Malhi |
| 5,351,211 A | 9/1994 | Higeta et al. |
| 5,422,585 A | 6/1995 | Fan Chiangi et al. |
| 5,581,738 A | 12/1996 | Dombrowski |
| 5,606,567 A | 2/1997 | Agrawal et al. |
| 5,625,288 A | 4/1997 | Snyder et al. |
| 5,642,262 A * | 6/1997 | Terrill et al. ............... 361/783 |
| 5,751,163 A * | 5/1998 | Tang et al. ............... 324/158.1 |
| 5,818,250 A | 10/1998 | Yeung et al. |
| 5,845,233 A | 12/1998 | Fishburn |
| 5,920,201 A * | 7/1999 | Mehrotra et al. ........... 324/765 |
| 5,923,676 A | 7/1999 | Sunter et al. |
| 5,929,684 A | 7/1999 | Daniel |
| 5,966,021 A * | 10/1999 | Eliashberg et al. ...... 324/158.1 |
| 5,973,976 A | 10/1999 | Sato |
| 6,057,691 A | 5/2000 | Kobayashi |
| 6,160,411 A * | 12/2000 | Eliashberg et al. ......... 324/760 |
| 6,316,958 B1 * | 11/2001 | Jenkins, IV ................. 326/40 |
| 6,353,332 B1 * | 3/2002 | Brelet ......................... 326/40 |
| 6,433,569 B1 * | 8/2002 | Eliashberg et al. ......... 324/760 |
| 6,437,597 B1 * | 8/2002 | Chan ........................... 326/41 |
| 6,437,713 B1 * | 8/2002 | Lesea .......................... 326/41 |
| 6,452,459 B1 * | 9/2002 | Chan et al. ................. 324/617 |
| 6,466,049 B1 * | 10/2002 | Diba et al. .................... 326/40 |

OTHER PUBLICATIONS

"The Programmable Logic Data Book", 1998, available from Xilinx, Inc. 2100 Logic Drive, San Jose, CA 95124, pp. 4–5 to 4–40.
Application Note from Xilinx, Inc., "Efficient Shift Registers, LFSR Counters, and Long Pseudo–Random Sequence Generators" by Peter Alfke, Jul. 7, 1996.
"Signal Delay in RC Tree Networks" IEEE Transactions on Computer–Aided Design, vol. CAD–2, No. 3, Jul. 1983, pp. 202–211.

* cited by examiner

Primary Examiner—Kamand Cuneo
Assistant Examiner—Jermele Hollington
(74) Attorney, Agent, or Firm—Patrick T. Bever; Edel M. Young; Arthur J. Behiel

(57) ABSTRACT

A method for dynamically burn-in testing a PLD by either configuring or fabricating the PLD to implement a self-executing logic operation that automatically and repeatedly turns on and off selected transistors of the PLD using only static test signals. The self-executing logic operation implemented by the PLD includes a driving logic function (e.g., an oscillator) and a driven logic function (e.g., a counter). The PLD is placed on a conventional load board and heated in a conventional oven while static test signals are applied to selected terminals of the PLD through the load board, thereby causing the PLD to implement the self-executing logic operation.

20 Claims, 5 Drawing Sheets

METHOD FOR IMPLEMENTING DYNAMIC BURN-IN TESTING USING STATIC TEST SIGNALS

FIELD OF THE INVENTION

This invention relates to the field of integrated circuits, and more specifically to programmable logic devices.

BACKGROUND OF THE INVENTION

Programmable logic devices (PLDs) are a class of integrated circuits (ICs) that can be programmed by a user to emulate various logic functions. Logic designers typically use PLDs to implement control logic in electronic systems because they are relatively easy to program, and often can be reprogrammed to update the emulated logic function. This often makes the use of PLDs less costly in comparison to custom hardwired or "application specific" integrated circuits (ASICs).

Like many integrated circuits, PLD manufacturers test their PLDs to avoid selling defective devices to customers. Part of this testing may include a burn-in test procedure that involves placing the PLDs on load boards that apply test signals to the PLDs while they are heated in an oven.

FIGS. 1 through 3 are simplified diagrams depicting a burn-in oven 1 during a conventional static burn-in test. Load boards 10 are mounted in oven 1 with each load board 10 having several PLDs 100 mounted thereon. Load boards 10 apply test signals to the input/output (I/O) terminals of PLDs 100. For example, as indicated in FIG. 2, each PLD 100 is mounted on a test fixture 12 that is connected to a pair of signal conduits 14 and 16 (e.g., power and ground) formed in load board 10. Referring to FIG. 3, each I/O terminal (e.g., solder bump) 110 of PLDs 100 contacts either a power mount 12-1 or a ground mount 12-2, which are respectively connected to power signal conduit 14 and ground signal conduit 16. During the burn-in testing procedure, PLDs 100 are periodically removed from oven 1 and tested for operability. Any PLDs that fail the burn-in testing are discarded.

A typical cause of PLD failure during burn-in testing is the heat-induced migration of the various dopants that form the conductive channels in the PLD substrate. Dopants (e.g., boron or phosphorous) are introduced during fabrication to produce conductive channels and other doped regions that are separated by un-doped regions of the substrate. During burn-in testing, the heated oven increases the tendency of these dopants to migrate into the un-doped regions of the substrate. If sufficient migration takes place, adjacent regions become shorted to each other, thereby causing the PLD to fail.

Although static burn-in testing tends to detect many defective PLDs, some PLDs that pass static burn-in testing may fail under actual operating conditions. That is, after a customer receives a PLD, the PLD is typically programmed (configured) to implement a desired logic function. During subsequent operation, the various transistors of the PLD are dynamically operated (i.e., repeatedly turned on and off) during the implementation of the logic function. As is understood in the art, this dynamic operation stresses the doped regions of the PLD by repeatedly altering the voltages applied to these regions. This increased stress increases the tendency for dopants to migrate, thereby increasing the chance that "weak" devices will fail if operated under normal operating conditions after an extended period of time. Therefore, because static burn-in testing maintains the various configurable parts of the PLD in a static (unchanging) state, it is not optimal for detecting some defective PLDs that, if shipped to a customer, may potentially cause the customer to stop using the PLD manufacturer's products.

Conventional methods for providing dynamic burn-in testing are complex and expensive. First, each PLD must be programmed to implement a test logic operation that operates in response to applied dynamic test signals. Second, the transmission of the dynamic test signals to the PLDs during burn-in testing requires more than the two conduits that are used in static burn-in testing (i.e., power conduit 14 and ground conduit 16; see FIG. 2). For example, a clock signal and/or other dynamic test signals must be provided to appropriate terminals of each PLD under test. Because each burn-in load board can hold dozens of devices, a large number of conduits may be required on each load board to support conventional dynamic burn-in testing, thereby greatly increasing the cost of each load board. Finally, a modified burn-in oven must be provided that facilitates passage of the test signals to the load boards.

What is needed is a practical dynamic burn-in testing procedure that eliminates the extra costs associated with conventional dynamic burn-in test methods, discussed above.

SUMMARY OF THE INVENTION

The present invention is directed to a method for dynamically burn-in testing a PLD by either configuring or fabricating the PLD to implement a self-executing logic operation that automatically and repeatedly turns on and off selected transistors of the PLD using only static test signals. The PLD is placed on a conventional load board and heated in a conventional oven while static test signals are applied to selected terminals of the PLD through the load board, thereby performing a dynamic burn-in test due to the PLD's implementation of the self-executing logic operation. Accordingly, dynamic burn-in testing is performed using conventional static burn-in testing equipment (i.e., without the need for externally supplied dynamic test signals), thereby minimizing PLD testing costs.

In accordance with an embodiment of the present invention, the self-executing logic operation implemented by the PLD during dynamic burn-in testing includes a driving logic function and a driven logic function. The driving logic function, which is implemented in a first portion of the PLD logic resources, generates an internal dynamic test signal in response to externally-supplied static test signals, thereby avoiding the need for externally supplied dynamic signals. The internal dynamic test signal is then supplied to the driven logic function, which is implemented in a second portion of the PLD logic resources. Specifically, the second portion of the PLD logic resources is configured to repeatedly perform a logic operation such that selected transistors are continuously turned on and off in response to the internal dynamic test signal.

In accordance with a disclosed embodiment of the present invention, the driving logic function of the self-executing logic operation is implemented as an oscillator formed by connecting two logic elements (e.g., an AND gate and an inverter) in a loop such that the logic elements generate the internal dynamic test signal that alternates between logic "0" and logic "1". The alternating internal dynamic test signal is tapped from one of the logic elements and is supplied to the driven logic function of the self-executing logic operation. An optional delay circuit is provided between the logic elements to increase the test signal period (i.e., the period between sequential logic "0" and logic "1" signals) to a suitable level. By implementing an oscillator in this manner, the present invention avoids the need for an external clock signal, thereby facilitating dynamic burn-in testing using static test signals.

In the disclosed embodiment, the driven logic function of the self-executing logic operation includes a 16-bit counter that repeatedly cycles through its count cycle in response to the internal dynamic test signal, which is utilized as a clock signal. Accordingly, the transistors implementing the 16-bit counter are repeatedly turned on and off. By configuring the logic resources of the PLD to implement a 16-bit counter (or another self-executing and repeating logic function), the need for externally-supplied dynamic test signals is removed, thereby further facilitating dynamic burn-in testing using static test signals.

Further, in accordance with the disclosed embodiment, one or more I/O resources are configured to selectively apply count values generated by the 16-bit counter to associated I/O terminals of the PLD. During burn-in testing, a first static test signal is utilized to control these I/O resources to prevent the transmission of the count values to the I/O terminals. A subsequent operability test (e.g., performed after burn-in testing is completed) is performed by applying a second static test signal that causes the count values generated by the 16-bit counter to be applied to the I/O terminals, thereby indicating that the PLD is operating properly.

In accordance with another embodiment, a PLD is fabricated such that the various configuration memory cells of the PLD "wake up" in a predefined default state that causes the PLD to automatically implement the self-executing logic operation each time power is initially applied. Specifically, the PLD is fabricated such that the configuration memory cells automatically enter the predefined default configuration state at power-up, and this predefined default state causes the interconnect resources and the configurable logic resources of the PLD to implement the self-executing logic operation. Methods for biasing memory cells to "wake up" in a particular logic state (e.g., such that a logic "1" is generated at the memory cell's output terminal) are well known, and any such method can be utilized herein. Accordingly, dynamic burn-in testing is easily performed by mounting "cold" PLDs onto conventional static load boards, and then heating the PLDs in a conventional oven while applying static signals. When the static signals are applied, each PLD enters the predefined default state, and begins implementing the self-executing logic operation (described above). Upon completion of testing, the predefined default state is overwritten by configuration data associated with a user's logic function.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to methods for dynamically burn-in testing programmable logic devices (PLDs) by either configuring or fabricating the PLDs to implement a self-executing logic operation. While the present invention is described below with particular reference to complex PLDs (CPLDs), the present invention may also be beneficially utilized in other integrated circuits (ICs) and/or other types of PLDs.

Figure 4:
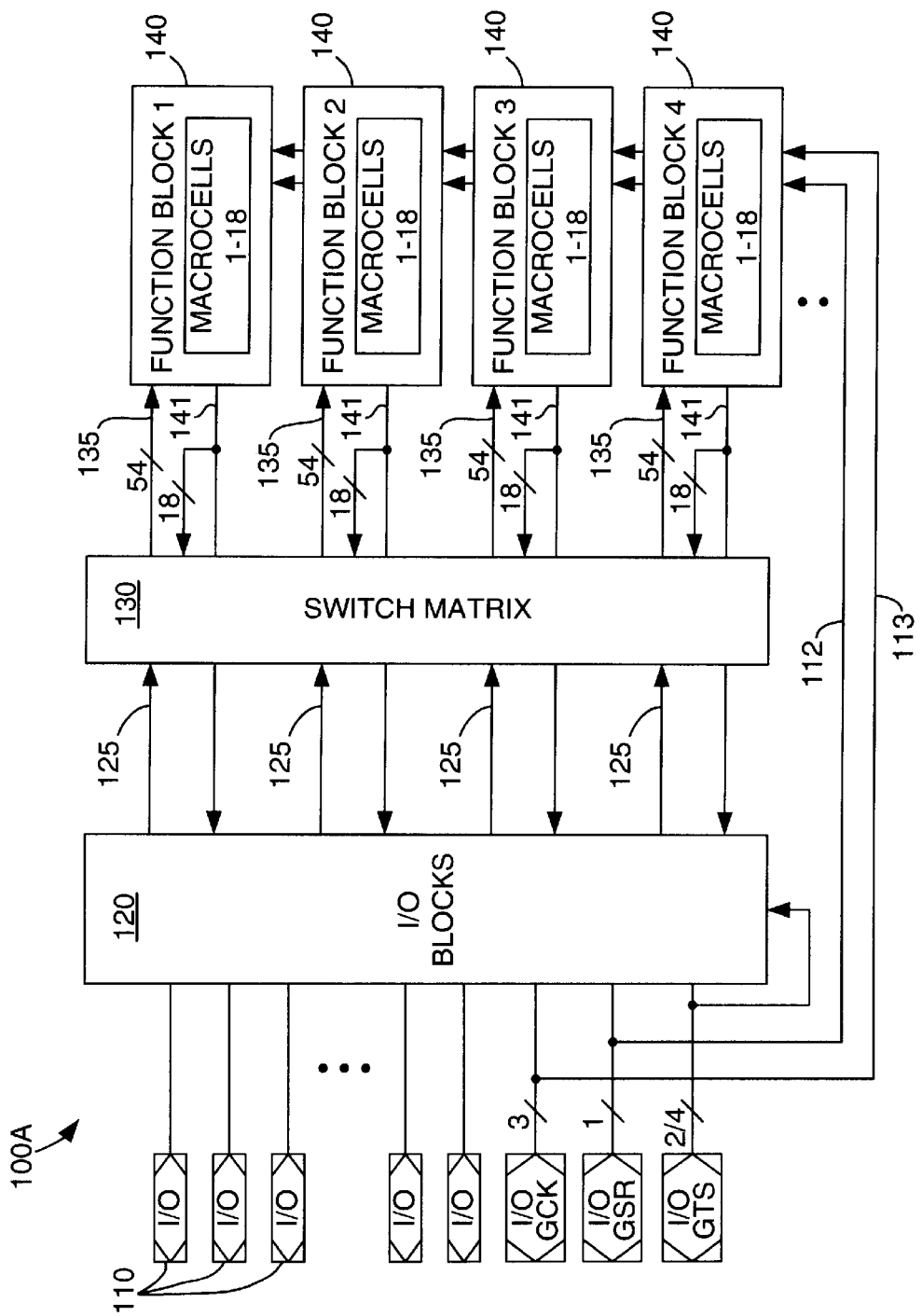
FIG. 4 is a simplified schematic diagram illustrating an example of a PLD.

FIG. 4 shows a simplified block diagram of a CPLD 100A, which represents one type of PLD. CPLD 100A includes features common to the XC9500 CPLD family produced by Xilinx, Inc. of San Jose, Calif. Each CPLD 100 of the XC9500 CPLD family consists of input/output (I/O) pins/bumps (terminals) 110 and I/O blocks (IOBs) 120 (collectively referred to herein as interconnect resources), an interconnect switch matrix (interconnect resources) 130, and several function blocks (FBs) 140 (configurable logic resources). IOBs 120 provide buffering for device input and output signals that are applied to I/O pins 110. All input signals from IOBs 120 enter switch matrix 130 on switch matrix input lines 125, and selected output signals from FBs 140 are fed back into switch matrix 130 on macrocell output lines 141. Each FB 140 receives fifty-four (54) input signals on FB input lines 135 from switch matrix 130 and produces ninety (90) P-term signals that are applied to any of eighteen (18) macrocells, each macrocell being programmable to provide a sum-of-products term using selected P-term signals. For each FB 140, twelve to eighteen output signals are selectively transmitted on macrocell output lines 141 to directly drive IOB 120 (along with optional corresponding output enable signals). In addition, each FB 140 selectively receives global set/reset signals and global clock signals on global set/reset lines 112 and global clock lines 113, respectively. These global signals are utilized to selectively synchronize, for example, the clocking operations of flip flops located in FBs 140.

Figure 5A:
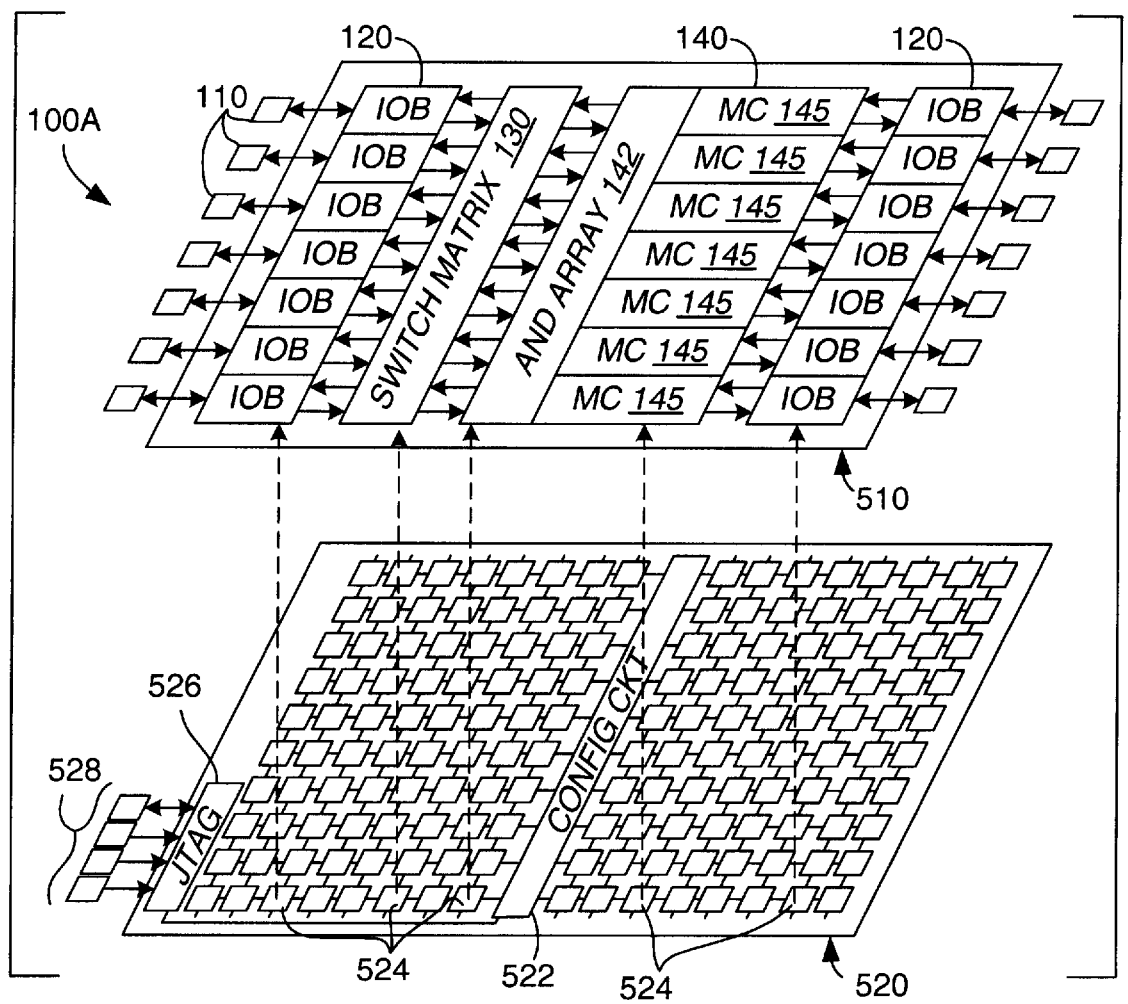
FIG. 5A is a split-level perspective view depicting simplified logic and configuration planes of the PLD shown in FIG. 4.

FIG. 5A is a split-level perspective view showing a simplified representation of CPLD 100A. To simplify the following description, CPLD 100A is functionally separated into a logic plane 510 that includes the programmable circuitry shown in FIG. 4, and a configuration plane 520 that includes a configurable memory circuit utilized to control the programmable circuitry of logic plane 510. Other simplifications and functional representations are utilized to facilitate the following description.

Configuration plane 520 generally includes a configuration circuit (CONFIG CKT) 522 and a configuration memory array made up of configuration memory cells 524. Configuration circuit 522 includes input and/or output terminals that are used to transmit configuration data, e.g., from JTAG pins 528 through a JTAG circuit 526 to configuration memory cells 524. Configuration memory cells 524 are typically arranged in rows and columns that are addressed by configuration circuit 522 during configuration (write) operations. That is, during a configuration operation, configuration circuit 522 routes configuration data from a bit stream transmitted to JTAG circuit 526 to configuration memory cells 524 to establish an operating state of CPLD 100A.

Figure 5B:
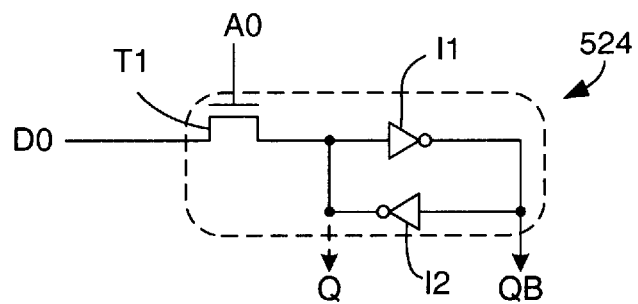
FIG. 5B is a simplified schematic diagram showing a configuration memory cell utilized in the configuration plane of the PLD shown in FIG. 5A.

FIG. 5B is a simplified circuit diagram illustrating a typical configuration memory cell 524 that is utilized in CPLD 100A. Configuration memory cell 524 includes a latch formed by inverters I1 and I2 that are programmed with data transmitted on configuration data line D0 via transistor T1, which is controlled by a configuration address signal transmitted on configuration address line A0. The values stored in configuration memory cell 524 are used to control a corresponding portion of CPLD 100A. For example, as indicated by the dashed-line arrows in FIG. 5A, configuration memory cells 524 are used to control programmable circuitry provided in the IOBs 120, switch matrix 130, and an AND array 142 and macrocells (MC) 145 of each FB 140 (one shown in FIG. 5A), thereby establishing the logic operation implemented by CPLD 100A.

Figure 6:
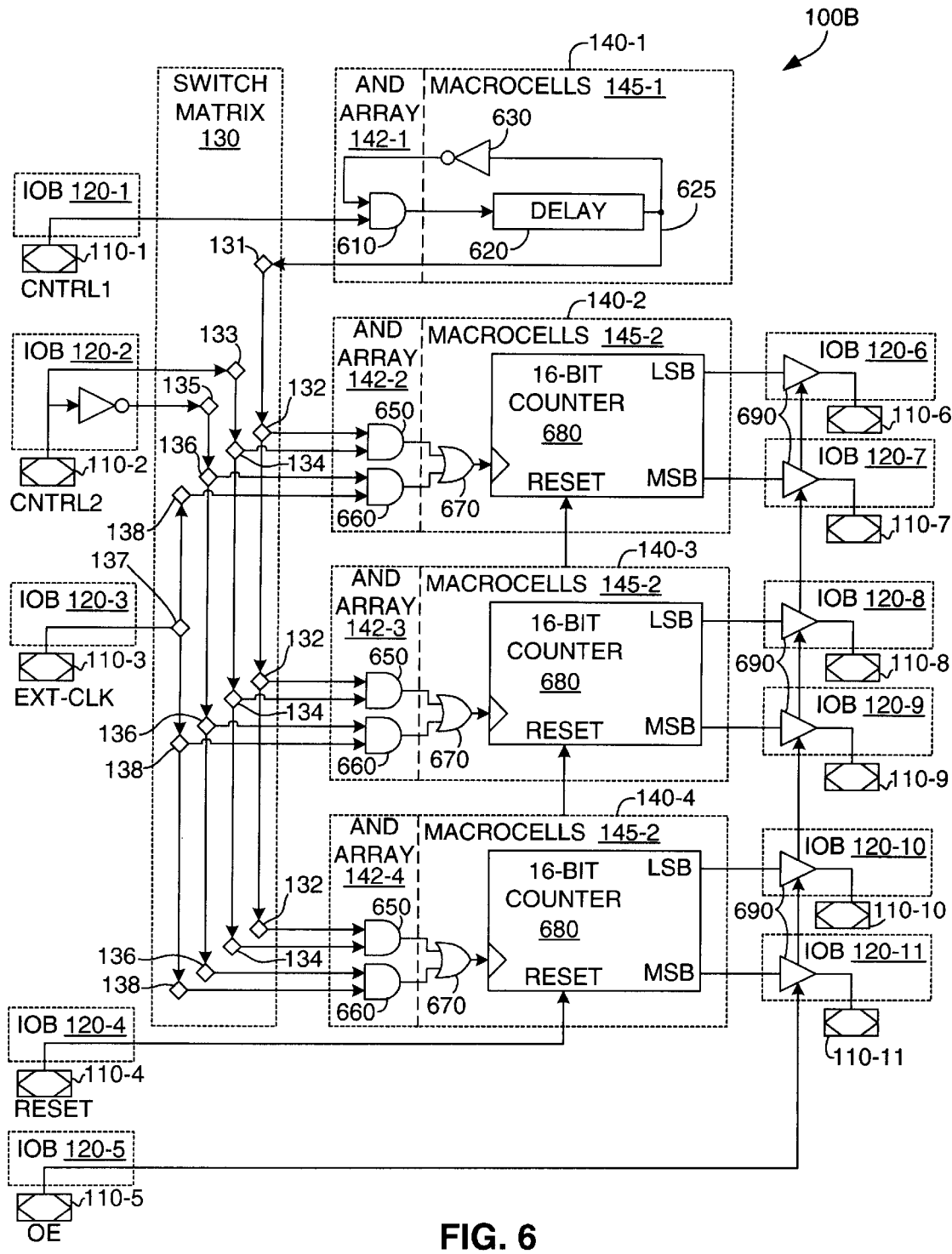
FIG. 6 is a simplified schematic diagram depicting a PLD configured in accordance with the present invention.

FIG. 6 is a simplified diagram showing a CPLD 100B that is configured to implement a self-executing logic operation in accordance with an embodiment of the present invention. To simplify the following description, portions of FBs (configurable logic resources) 140 and IOBs (I/O resources) 120 are superimposed with logic gates and/or logic circuits implemented in accordance the present embodiment. Note that the self-executing logic operation shown in FIG. 6 is implemented by controlling the logic resources (shown in FIG. 4) in accordance with configuration data stored in configuration memory cells 524 (see FIG. 5A). That is, the logic resources are not physically changed to implement the self-executing logic operation. Accordingly, after dynamic burn-in testing is performed using the methods described below, CPLD 100B can be re-configured to implement a customer's logic operation by over-writing the configuration data stored in configuration memory cells 524.

In accordance with the embodiment disclosed in FIG. 6, the self-executing logic operation implemented by CPLD 100B includes a driving (first) logic function that generates an internal dynamic test signal, and a driven (second) logic function that performs a repeating logic operation in a manner that continuously turned on and off selected transistors in response to the internal dynamic test signal. Note that the driving logic function and the driven logic function, either alone or in combination, need not perform a useful logic operation.

Referring to the upper portion of FIG. 6, the driving logic function of the self-executing logic operation is implemented in FB 140-1. In the disclosed embodiment, the driving logic function is implemented as an oscillator formed by a logic AND gate 610, an optional delay circuit 620, and an inverter 630. Logic AND gate 610 receives a first static test signal CNTRL1 from input pin 110-1 via IOB 120-1. Logic AND gate 610 also receives an output signal from inverter 630. When both of these signals are logic "1" (e.g., during burn-in testing), AND gate 610 generates a logic "1" output signal that is transmitted to delay circuit 620. The delayed signal generated by delay circuit 620 is then applied to the input terminal of inverter 630, when then generates a corresponding logic "0" output signal that causes logic AND gate 610 to generate a corresponding logic "0" output signal. In this manner, logic AND gate 610 and inverter 630 form an oscillator that generate the internal dynamic test signal which is provided via node 625 to the driven logic function of the self-executing logic operation (described below). Note that logic AND gate 610 and inverter 630 may be implemented in one or more macrocells (sub-portion) 145 (see FIG. 5A), and delay circuit 620 can be formed by the remaining macrocells of FB 140-1. Note also that delay circuit 620 is provided to limit the alternating internal dynamic test signal to a predetermined period (e.g., 1 MHz).

In the disclosed embodiment, the internal dynamic test signal generated in FB 140-1 is transmitted to switch matrix 130 for dissemination to the driven logic function of the self-executing logic operation, which is implemented in FBs 140-2, 140-3, and 140-4. In particular, the internal dynamic test signal is transmitted from node 625 along a feedback line to an interconnect switch 131. Interconnect switch 131 is controlled by a corresponding configuration memory cell (not shown) to route the internal dynamic test signal to a series of interconnect switches 132, which in turn are controlled to route the internal dynamic test signal into FBs 140-2, 140-3, and 140-4.

As mentioned above, FBs 140-2, 140-3, and 140-4 are configured to implement the driven logic function of the self-executing logic operation. In the disclosed embodiment, each of FBs 140-2, 140-3, and 140-4 are configured to implement a 16-bit counter 680 that is selectively clocked by the internal dynamic test signal received from FB 140-1 during burn-in testing. Again, each 16-bit counter 680 is implemented by configuring corresponding configuration memory cells using known techniques. 16-bit counters are selected as the driven logic function of the self-executing logic operation because they continuously repeat a count cycle without the need for external dynamic test signals. Those of ordinary skill in the art will recognize that other cyclic or repeating logic operations can also be implemented as the driven logic function of the self-executing logic operation.

As mentioned above, the internal dynamic test signal generated by FB 140-1 is routed into FBs 140-2, 140-3, and 140-4 through interconnect switches 132. Several other signals are also used to control the operation of 16-bit counters 680 such that they are self-executing during burn-in testing, and respond to external clock and control signals during subsequent operability testing. For example, referring to FB 140-2, a pair of logic AND gates 650 and 660 are combined with a logic OR gate 670 to apply a desired clock signal to each 16-bit counter 680. Logic AND gate 650 receives the internal dynamic test signal from interconnect switch 132, and a second static test signal (CNTRL2) from input pin 110-2 via IOB 120-2 and interconnect switches 133 and 134. Logic AND gate 660 receives an inverted form of the second test signal via interconnect switches 135 and 136, and an external clock (EXT-CLK) signal from input pin 110-3 via IOB 120-3 and interconnect switches 137 and 138. The output signals generated by logic AND gates 650 and 660 are transmitted to logic OR gate 670, which transmits an output signal to the clock terminal of 16-bit counter 680 (e.g., as a product-term clock signal). During burn-in testing, the second static test signal (CNTRL2) is held high, thereby causing logic AND gate 650 and logic OR gate 670 to pass the internal dynamic test signal received from FB 140-1 to the clock terminal of 16-bit counter 680. Note that the output signal from logic AND gate 660 is maintained low due to the inverted signal received from interconnect switch 136). During operability testing (e.g., performed after burn-in testing is completed), the second static test signal is held low, thereby causing logic OR gate 670 to pass an externally supplied clock signal to 16-bit counter 680.

Additional control logic is optionally included in the self-executing logic operation implemented by CPLD 100B to facilitate the operability testing performed after dynamic burn-in testing using the methods described above. For example, an optional reset control signal is selectively applied via input terminal 110-4 and IOB 120-4 to selectively reset 16-bit counters 680. In addition, an output enable (OE) signal is selectively applied via input terminal 110-5 and IOB 120-5 to control tri-state output buffers 690 associated with IOBs 120-6 through 120-11. IOBS 120-6 through 120-11 are configured to selectively apply least significant bit (LSB) and most significant bit (MSB) values that are generated by 16-bit counters 680 to associated I/O terminals 110-6 through 110-11 of CPLD 100B. During burn-in testing, static test signal OE is maintained in a first state (e.g., logic "0") to control tri-state buffers 690 to prevent the transmission of the LSB and MSB count values to associated I/O terminals 110-6 through 110-11. During a subsequent operability test, static test signal OE is maintained in a second state (e.g., logic "1") to cause the count values generated by 16-bit counters 680 to be applied to the I/O terminals, which indicate that CPLD 100B is operating properly.

Figure 7:
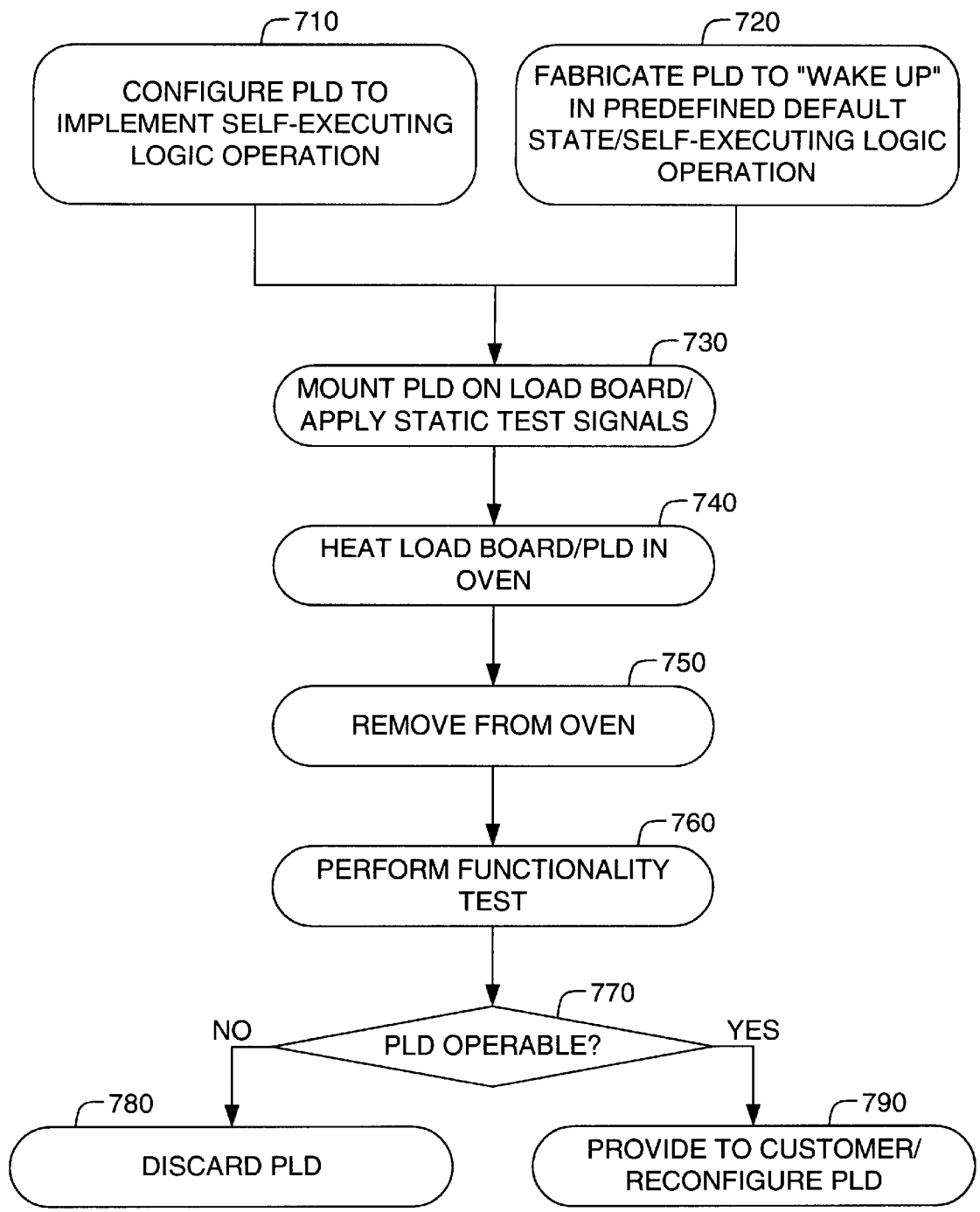
FIG. 7 is a flow diagram showing a method for performing dynamic burn-in testing according to the present invention.

FIG. 7 is a flow diagram showing a method for burn-in testing a PLD. According to alternative embodiments of the present invention, the PLD is either configured to implement a self-executing logic operation (step 710), or is fabricated such that the configuration memory cells of the PLD "wake up" in a pre-defined default state that causes the PLD to implement a self-executing logic operation (step 720).

Referring to FIG. 5A, the configuration embodiment (step 710) is performed using known methods (e.g., via JTAG circuit 526, discussed above), and is completed when configuration memory cells 524 are configured to implement, for example, the self-executing logic operation described above with reference to FIG. 6.

Alternatively, according to the fabrication embodiment, CPLD 100B is fabricated such that the various configuration memory cells 524 "wake up" in a predefined default state that causes CPLD 100B to automatically implement the self-executing logic operation each time power is initially applied. Specifically, referring to FIG. 5B, CPLD 100B is fabricated such that inverter I1 automatically generates a logic "1" (or logic "0") at power-up, thereby causing inverter I2 to generate a logic "0" (or logic "1"). The resulting configuration signal Q and QB are supplied to corresponding configurable logic associated with IOBs 120, switch matrix 130, or FB 140 in accordance with the predefined default state. Methods for fabricating transistors such that they are biased in this manner are well established. The cumulative configuration data thus fabricated into all configuration memory cells of CPLD 100B causes IOBs 120, switch matrix 130, and FBs 140 to implement the self-executing logic operation shown in FIG. 6.

Figure 1:
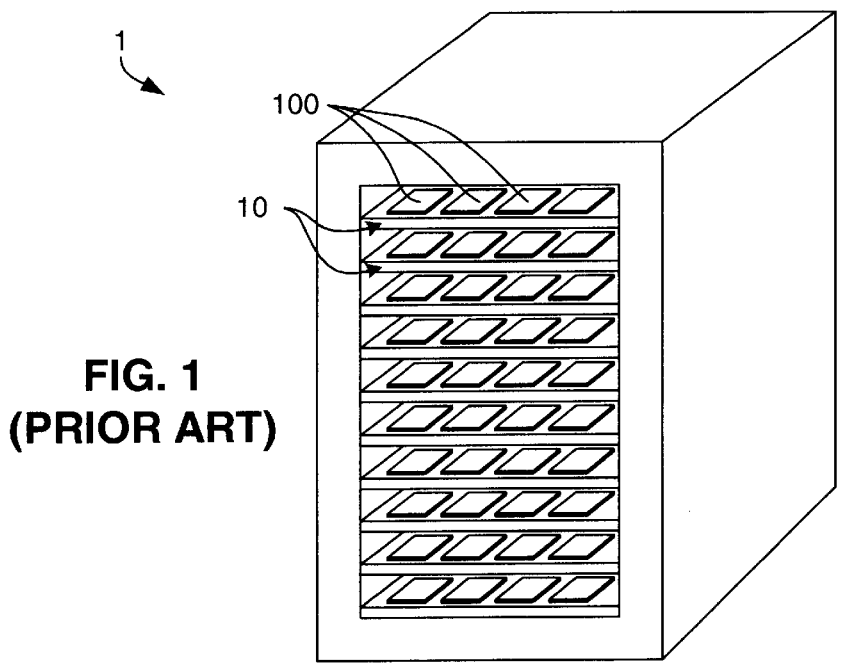
FIG. 1 is a perspective view showing an apparatus used to test integrated circuits using conventional static burn-in testing procedures.
Figure 2:
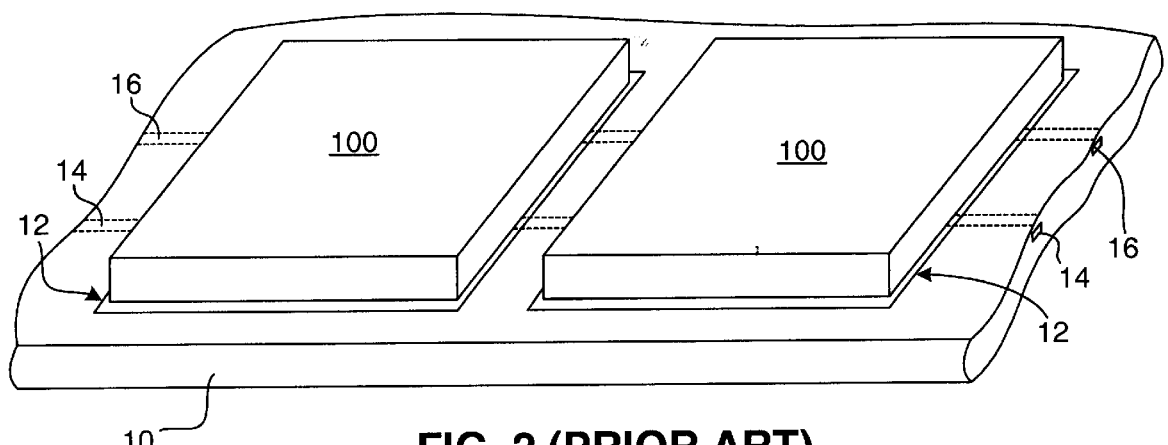
FIG. 2 is a perspective view showing a load board of the apparatus shown in FIG. 1.
Figure 3:
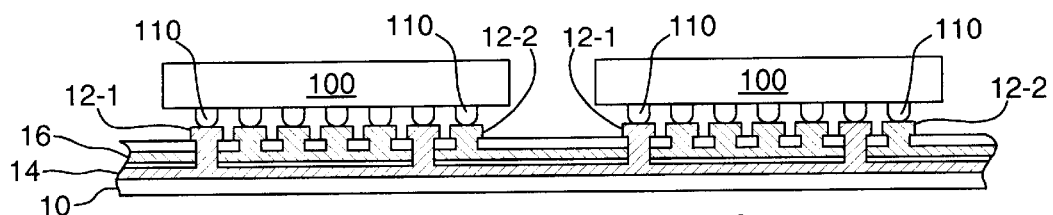
FIG. 3 is a cross-sectional side view showing integrated circuits mounted on the load board shown in FIG. 2.

With the PLD configured/fabricated to implement the self-executing logic operation, the PLD is then mounted onto a conventional static load board (e.g., load board 10; see FIG. 1) such that static test signals are applied to the PLD through a corresponding test fixture (e.g. test fixture 12; see FIG. 2) (step 730). The load board is then mounted into an oven (e.g., oven 1; see FIG. 1) with the static test signals applied to the PLD. Because the PLD is configured/ fabricated to implement the self-executing logic operation, dynamic burn-in testing is easily performed simply by mounting the PLD using conventional load boards and ovens while applying only static test signals. Specifically, as described above with reference to FIG. 6, when the static test signals CNTRL1 and CNTRL2 are applied, each PLD begins implementing the self-executing logic operation, which continues until these static test signals are terminated (e.g., when the PLD is removed from the oven (step 750) and subjected to an operability test (step 760). Note that the operability test allows a PLD manufacturer to determine whether the PLD is operating properly (step 770). If defective, the PLD is discarded (step 780), or otherwise prevented from being shipped to a customer. Alternatively, if the PLD proves to be operable, the PLD can be sold to a customer (step 790), who then reconfigures the PLD to overwrite the predefined default state using configuration data associated with the customer's logic operation.

In the above-described embodiment, the driven logic function (e.g., 16-bit counter 680; see FIG. 6) of the self-executing logic operation repeatedly cycles through its count cycle in response to the internal dynamic test signal received from the driving logic function (e.g., the oscillator implemented in FB 140-1). Accordingly, the transistors implementing 16-bit counter 680 are repeatedly turned on and off using only static control signals (e.g., CNTRL1 and CNTRL2). Therefore, the present invention avoids the need for externally-supplied dynamic test signals, thereby facilitating dynamic burn-in testing using a static burn-in test apparatus, such as that shown in FIG. 1.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method for burn-in testing a programmable logic device (PLD), the PLD including I/O resources, interconnect resources, and configurable logic resources that are controlled by associated configuration memory cells, the method comprising:

configuring the PLD such that the interconnect resources and the configurable logic resources implement a self-executing logic operation; and heating the PLD while applying only static test signals to selected terminals of the PLD, whereby the self-executing logic operation repeatedly turns on and off selected transistors of the PLD, thereby facilitating dynamic burn-in testing using only the static test signals.

2. The method according to claim 1, wherein heating is performed by mounting the PLD on a load board, and placing the load board in an oven.

3. The method according to claim 1, wherein configuring the PLD comprises:

configuring a first portion of the configurable logic resources to generate an internal dynamic test signal; and configuring a second portion of the configurable logic resources to implement a repeating logic operation such that selected transistors are continuously turned on and off in response to the internal dynamic test signal.

4. The method according to claim 3, wherein configuring the second portion comprises implementing a counter.

5. The method according to claim 3, further comprising configuring an I/O resource to prevent application of count signals onto an I/O terminal in response to a first static test signal, and to pass count signals onto the I/O terminal in response to a second static test signal.

6. The method according to claim 3, wherein configuring the first portion comprises configuring a first sub-portion to implement an oscillator.

7. The method according to claim 6, wherein configuring the first sub-portion comprises:

forming a logic AND gate having first and second input terminals, the first input terminal being coupled to receive a first static test signal, the logic AND gate generating a first output signal; and forming an inverter for receiving the first output signal from the logic AND gate, and for transmitting a second output signal to the second input terminal of the logic AND gate.

8. The method according to claim 7, wherein configuring the first portion further comprises configuring a second sub-portion to implement a delay circuit for delaying the first output signal generated by the logic AND gate.

9. A method for burn-in testing a programmable logic device (PLD), the PLD including I/O resources, interconnect resources, and configurable logic resources that are controlled by associated configuration memory cells, the method comprising:

fabricating the PLD such that the configuration memory cells automatically enter a predefined default configuration state at power-up, the predefined default state causing the interconnect resources and the configurable logic resources to implement a self-executing logic operation; and heating the PLD while applying only static test signals to selected terminals of the PLD, whereby the self-executing logic operation repeatedly turns on and off selected transistors of the PLD, thereby facilitating dynamic burn-in testing using only the static test signals.

10. The method according to claim 9, wherein each configuration memory cell includes a latch formed by a first inverter and a second inverter, and wherein fabricating the PLD includes causing the first inverter of the configuration memory cell to generate a pre-defined output signal at power-up.

11. The method according to claim 9, wherein heating is performed by mounting the PLD on a load board, and placing the load board in an oven.

12. The method according to claim 9, wherein fabricating the PLD comprises:

biasing configuration memory cells associated with a first portion of the configurable logic resources to enter the predefined default state such that the first portion generates an internal dynamic test signal; and biasing configuration memory cells associated with a second portion of the configurable logic resources to enter the predefined default state such that the second portion implements a repeating logic operation that continuously turns on and off selected transistors in response to the internal dynamic test signal.

13. The method according to claim 12, wherein biasing the configuration memory cells associated with the second portion of the configurable logic resources comprises implementing a counter.

14. The method according to claim 12, wherein fabricating the PLD further comprises biasing configuration memory cells associated with the I/O resources to prevent application of count signals onto an I/O terminal in response to a first static test signal, and to pass count signals onto the I/O terminals in response to a second static test signal.

15. The method according to claim 12, wherein biasing the configuration memory cells associated with the first portion of the configurable logic resources comprises implementing an oscillator.

16. The method according to claim 15, wherein biasing the configuration memory cells associated with the first portion of the configurable logic resources further comprises forming a logic AND gate having first and second input terminals, the first input terminal being coupled to receive a first static test signal, the logic AND gate generating a first output signal; and forming an inverter for receiving the first output signal from the logic AND gate, and for transmitting a second output signal to the second input terminal of the logic AND gate.

17. The method according to claim 16, wherein biasing the configuration memory cells associated with the first portion of the configurable logic resources further comprises configuring a second sub-portion to implement a delay circuit for delaying the first output signal generated by the logic AND gate.

18. A programmable logic device (PLD) comprising I/O resources, interconnect resources, and configurable logic resources that are controlled by associated configuration memory cells, wherein the configuration memory cells are fabricated to automatically enter a predefined default configuration state at power-up, the predefined default state causing the interconnect resources and the configurable logic resources to implement a self-executing logic operation using only static test signals.

19. The PLD according to claim 18, wherein a first group of configuration memory cells associated with a first portion of the configurable logic resources that are fabricated to enter the predefined default state such that the first portion generates an internal dynamic test signal, and wherein a second group of configuration memory cells associated with a second portion of the configurable logic resources that are fabricated to enter the predefined default state such that the first portion implements a repeating logic operation such that selected transistors are continuously turned on and off in response to the internal dynamic test signal.

20. The PLD according to claim 19, wherein the first group of memory cells are fabricated such that the first portion implements an oscillator, and wherein the second group of memory cells are fabricated such that the second portion implements a counter.

* * * * *